United States Patent
Barrett, Jr. et al.

(10) Patent No.: US 6,473,772 B1
(45) Date of Patent: Oct. 29, 2002

(54) APPARATUS AND METHODS FOR DYNAMIC SIMULATION EVENT TRIGGERING

(75) Inventors: Archie Don Barrett, Jr., Lago Vista; Jason Raymond Baumgartner; Sriram Srinivasan Mandyam, both of Austin; Robert James Ramirez, New Braunfels; Brett Adam St. Onge; Kenneth Lee Wright, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/213,913

(22) Filed: Dec. 17, 1998

(51) Int. Cl.⁷ .............................................. G06F 17/30
(52) U.S. Cl. ...................... 707/104.1; 707/100; 703/17
(58) Field of Search ................................ 707/100–102, 707/104.1, 3–6; 703/13–17, 21–28

(56) References Cited

U.S. PATENT DOCUMENTS

| | | | |
|---|---|---|---|
| 5,485,600 A | * 1/1996 | Joseph et al. ................. | 703/13 |
| 5,490,266 A | * 2/1996 | Sturges ........................ | 703/15 |
| 5,628,017 A | * 5/1997 | Kimmerly et al. ............. | 717/4 |
| 5,764,953 A | * 6/1998 | Collins et al. ................. | 703/17 |
| 5,794,005 A | * 8/1998 | Steinman .................... | 703/17 |
| 6,263,303 B1 | * 7/2001 | Yu et al. ...................... | 703/19 |

OTHER PUBLICATIONS

"Dynamic Event Controller for Increasing Simulation Coverage," *IBM Technical Disclosure Bulletin*, vol. 40 No. 03, Mar. 1997, pp. 157–159.

"Method to Compute Test Coverage in Complex Computer System Simulation," *IBM Technical Disclosure Bulletin*, vol. 40 No. 03, Mar. 1997, pp. 1–4.

* cited by examiner

*Primary Examiner*—Maria N. Von Buhr
(74) *Attorney, Agent, or Firm*—Barry S. Newberger; Winstead Sechrest & Minick P.C.; Leslie Van Leeuwen

(57) ABSTRACT

A method and apparatus for dynamically driving events in a simulation of a data processing system are implemented. Events, or system states, are generated by drivers located at predetermined locations within the simulation model under test.

These events, which are drawn from a predetermined class of events, termed "effects," are driven in response to other events observed by monitors disposed within the simulation model in accordance with a predetermined set of "causes," and a set of "rules" that map causes to effects. The driving of events is mediated by a library process that receives observed events from the monitors, in the form of data structures, stored them in a database, and passes the effects to be driven to the appropriate driver in accordance with the set of rules, also data structures stored in the database, when a cause corresponds to a observed event.

30 Claims, 10 Drawing Sheets

| ID | Location | Address | Type | Size | Delay | Set Flag | Unset Flag |
|---|---|---|---|---|---|---|---|
|  |  |  |  |  |  |  |  |
|  |  |  |  |  |  |  |  |

Exemplary Effect Structure

| ID | Location | Address | Type | Size | Delay | Set Flag | Unset Flag |
|---|---|---|---|---|---|---|---|
| 1 | PCI0 | 0x410000 | Write | 32 | 0 |  |  |
| 1 | PCI0 | 0x520000 | Read | 32 | 0 |  |  |

Exemplary Effect Structure Using Flags

| ID | Location | Address | Type | Size | Delay | Set Flag | Unset Flag |
|---|---|---|---|---|---|---|---|
| 1 |  |  |  |  |  | 34 |  |
| 1 | PCI0 | 0x231000 | Read |  |  |  |  |
| 1 |  |  |  |  |  |  | 34 |

FIG. 5D

APPARATUS AND METHODS FOR DYNAMIC SIMULATION EVENT TRIGGERING

TECHNICAL FIELD

The present invention relates in general to data processing systems, and in particular, to event triggering in simulations of multi-processor (MP) systems.

BACKGROUND INFORMATION

Multi-processor (MP) data processing systems necessarily include a plurality of processors coupled to one or more buses whereby the processors interact with other parts of the data processing system or among themselves. As a consequence, two or more devices may contend for a bus, or try to access the same location in a peripheral device, such as a memory or input/output (I/O) device. Such MP systems may be verified by simulations wherein simulated processors are "assembled" into the system, which is then simulated by running processor cycles.

This verification via simulation may require a large amount of development time. This is due to the relative slowness of the simulator, and the large number of cycles needed to fully test a complex data processing system. Because of these time constraints, simulation tools use event generators that directly trigger events, or system states, on the buses, rather than creating events through processor instruction streams. Moreover, the time of occurrence of instruction-stream-generated events cannot be exactly predicted, so contentions cannot be ensured.

However, because events are triggered directly, and not through processor instruction streams, the test case under simulation may never create scenarios that would cause the event generators (which may sometimes be referred to as "irritators") to drive events, or may cause events to be random. Thus, there is a need in the art for apparatus and methods which integrate event generation into the test case generator being used to generate the test case.

Additionally, coverage tools may be used during simulation to track system states. If, a system state has already occurred in the simulation, then it is not necessary to repeat that state. Conversely, if a system state hasn't been reached, then, to ensure completeness, a coverage tool is used to track "uncovered" events during a simulation run. Uncovered events are events which have not been observed in the simulation but are otherwise important in the verification of the system under simulation. There is a need in the art for a mechanism by which a coverage tool can communicate with the irritators in order to cause events that are otherwise uncovered to occur.

SUMMARY OF THE INVENTION

The aforementioned needs are addressed by the present invention. Accordingly, there is provided, in a first form, a method of simulation event triggering. The method includes the step of providing a predetermined set of data structures, wherein a first subset of the data structures define precursor states in a simulation model, a second subset define a plurality of effects, and a third subset define rules mapping precursor states to one or more corresponding effects. Driving at least one of the plurality of effects, wherein the effect is operable for in response to a simulation event corresponding to at least one of the precursor events, is also a step of the method.

There is also provided, in a second form, a computer program product adaptable for storage on storage media, the program product operable for simulation event triggering. The program product constitutes programming for providing a predetermined set of data structures, wherein a first subset of the data structures define precursor states in a simulation model, a second subset define a plurality of effects, and a third subset define rules mapping precursor states to one or more corresponding effects, and programming for driving at least one of the plurality of effects, wherein the effect is operable for in response to a simulation event corresponding to at least one of the precursor events.

Additionally, there is provided, in a third form, a data processing system for simulation event triggering which contains circuitry operable for providing a predetermined set of data structures, wherein a first subset of the data structures define precursor states in a simulation model, a second subset define a plurality of effects, and a third subset define rules mapping precursor states to one or more corresponding effects. The data processing system also constitutes circuitry operable for driving at least one of the plurality of effects, wherein the effect is operable for in response to a simulation event corresponding to at least one of the precursor events.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates, in flowchart form, a monitor methodology in accordance with an embodiment of the present invention;

FIG. 5D illustrates effect data structures in accordance with an embodiment of the present invention;

DETAILED DESCRIPTION

Figure 1:
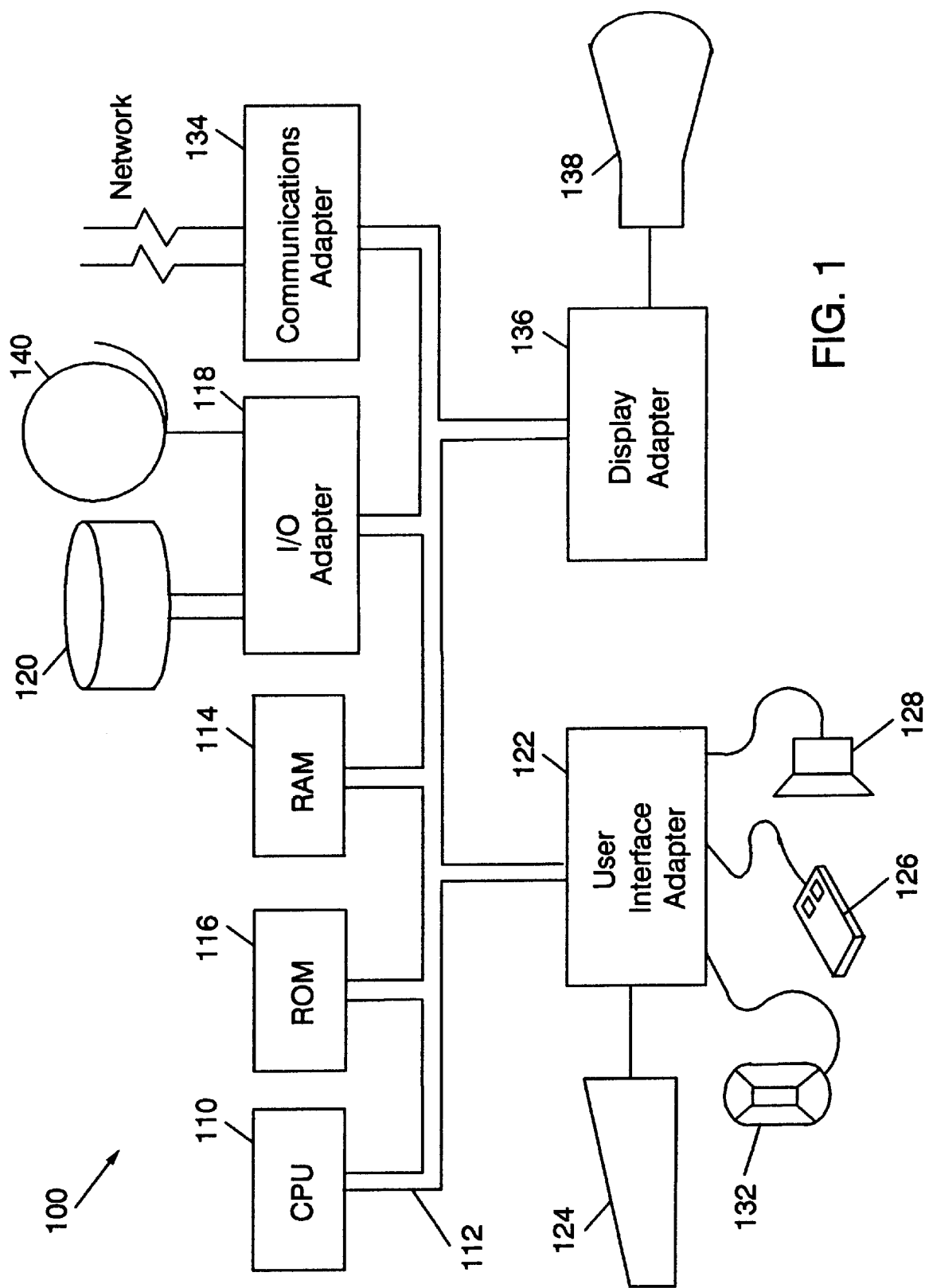
FIG. 1 illustrates, in block diagram form, a data processing system in accordance with an embodiment of the present invention.

The present invention provides a mechanism for dynamically triggering events in simulations of multi-processor (MP) data processing systems. Monitors are located at observable interfaces in the system under simulation. Monitors observe events at the particular location of the monitor, and logs the events into a database via an interface which is referred to as the library. In response to events logged into the database, drivers generate a stream of actions in the system. Drivers may be located on interfaces within the system, and there may be multiple drivers deployed throughout the system under simulation. The library provides the interface to the database. The database contains user-specified definitions of system states, referred to as "causes," and the action streams, referred to as "effects" for the drivers to perform when causes are observed via the monitors.

In the following description, numerous specific details are set forth such as specific word or byte lengths, addresses, buses, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, an example is shown of a data processing system 100 which may be used for the invention. The system has a central processing unit (CPU) 110, which is coupled to various other components by system bus 112. Read only memory ("ROM") 116 is coupled to the system bus 112 and includes a basic input/output system ("BIOS") that controls certain basic functions of the data processing system 100. Random access memory ("RAM") 114, I/O adapter 11 8, and communications adapter 134 are also coupled to the system bus 112. CPU 110 may perform the methods of the present invention under control of instructions contained in RAM 114. I/O adapter 118 may be a small computer system interface ("SCSI") adapter that communicates with a disk storage device 120. Communications adapter 134 interconnects bus 112 with an outside network enabling the data processing system to communicate with other such systems. Input/Output devices are also connected to system bus 112 via user interface adapter 122 and display adapter 136. Keyboard 124, track ball 132, mouse 126 and speaker 128 are all interconnected to bus 112 via user interface adapter 122. Display monitor 138 is connected to system bus 112 by display adapter 136. In this manner, a user is capable of inputting to the system throughout the keyboard 124, trackball 132 or mouse 126 and receiving output from the system via speaker 128 and display 138.

Preferred implementations of the invention include implementations as a computer system programmed to execute the method or methods described herein, and as a computer program product. According to the computer system implementation, sets of instructions for executing the method or methods are resident in the random access memory 114 of one or more computer systems configured generally as described above. Until required by the computer system, the set of instructions may be stored as a computer program product in another computer memory, for example, in disk drive 120 (which may include a removable memory such as an optical disk or floppy disk for eventual use in the disk drive 120). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change. While it is convenient to describe the invention in terms of instructions, symbols, characters, or the like, the reader should remember that all of these and similar terms should be associated with the appropriate physical elements.

Note that the invention may describe terms such as comparing, validating, selecting, identifying, or other terms that could be associated with a human operator. However, for at least a number of the operations described herein which form part of at least one of the embodiments, no action by a human operator is desirable. The operations described are, in large part, machine operations processing electrical signals to generate other electrical signals.

Figure 2:
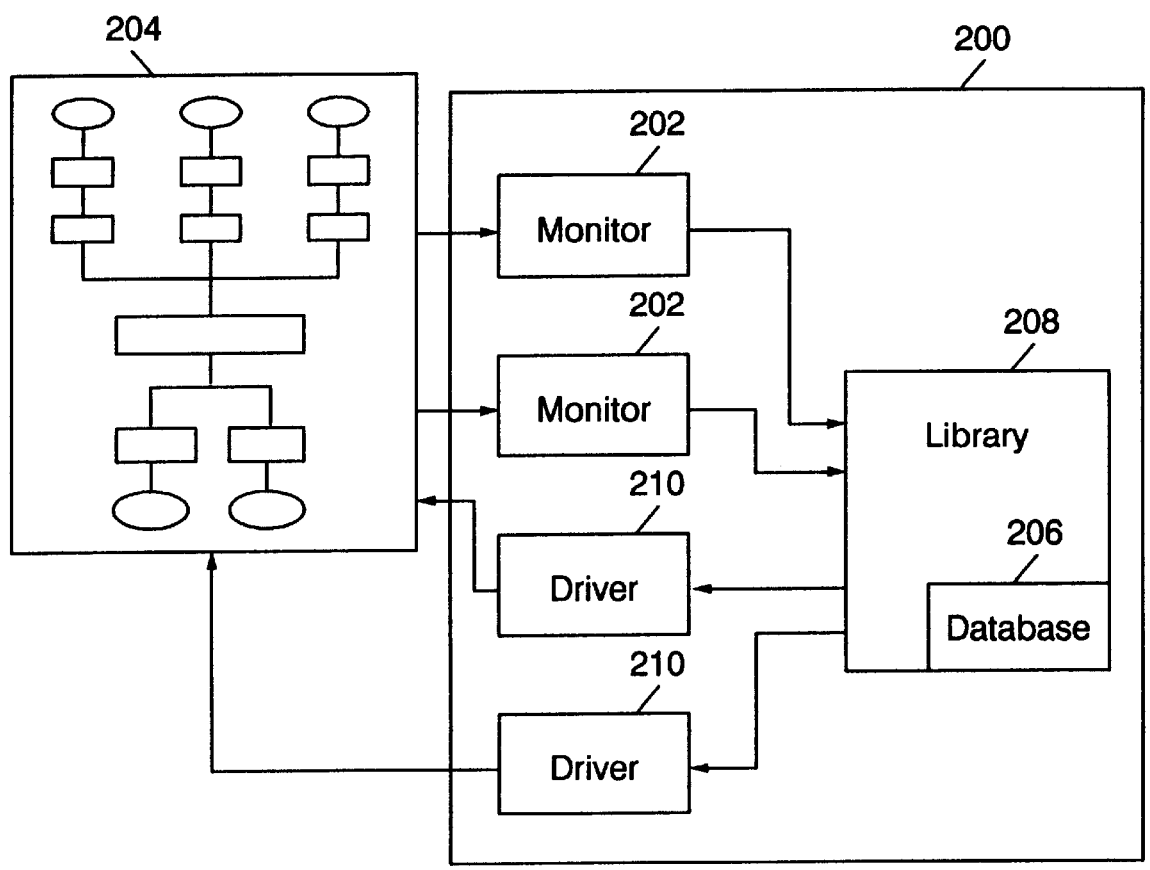
FIG. 2 illustrates a dynamic simulation event triggering mechanism in accordance with an embodiment of the present invention.

Refer now to FIG. 2 illustrating dynamic event triggering mechanism 200 in accordance with the present invention. Mechanism 200 includes a plurality of monitors 202 which receive event information from MP simulation model 204 which models the MP system under test. Each monitor 202 is associated with a particular location with an MP simulation model 204. A monitor 202 may be located on any well-architected interface. A well-architected interface is any interface that has an interface specification. The location of monitors within MP system simulation model 204 will be described further in conjunction with FIG. 3.

Each monitor 202 observes events at its respective location. An event is any occurrence or system condition that may take place within the system under test. For example, an event might be a processor instruction, a bus transaction, or a simulation cycle. Each monitor 202 observes events at its corresponding location, and enters the events into database 206, which is part of library 208. Library 208 provides an interface to database 206. The operation of monitors 202 and library 208 will be discussed in detail in conjunction with FIGS. 4 and 5A–5B, respectively.

Mechanism 200 also includes a plurality of drivers 210. Drivers 210 are responsible for taking action in response to an occurrence of an event included in a predetermined set of causes. Each driver 210 is associated with a location within MP system 204. A driver 210 may be located on any well-architected interface that can accept events from a driver. Each driver 210 receives the events it is to drive from database 206 via library 208. Drivers 210 may drive events in response to events reported by one of monitors 202, and stored in database 206. Events which may be driven in response to possible observed events will also be referred to as "effects." The events, if observed, that may give rise to effects will also be referred to as "causes." In other words, effects are a class of events representing system states which may result as a consequence of the occurrence of a precursor cause event; causes are themselves a class of events. Additionally, effects may include actions that control other causes. In this way, as will be described in detail below, events may be driven dynamically, whereby the effects driven later in the simulation depend on previously occurring effects that "enable" or "disable" precursor causes. The operation of drivers 210 will be discussed in detail in conjunction with FIG. 6.

Figure 3:
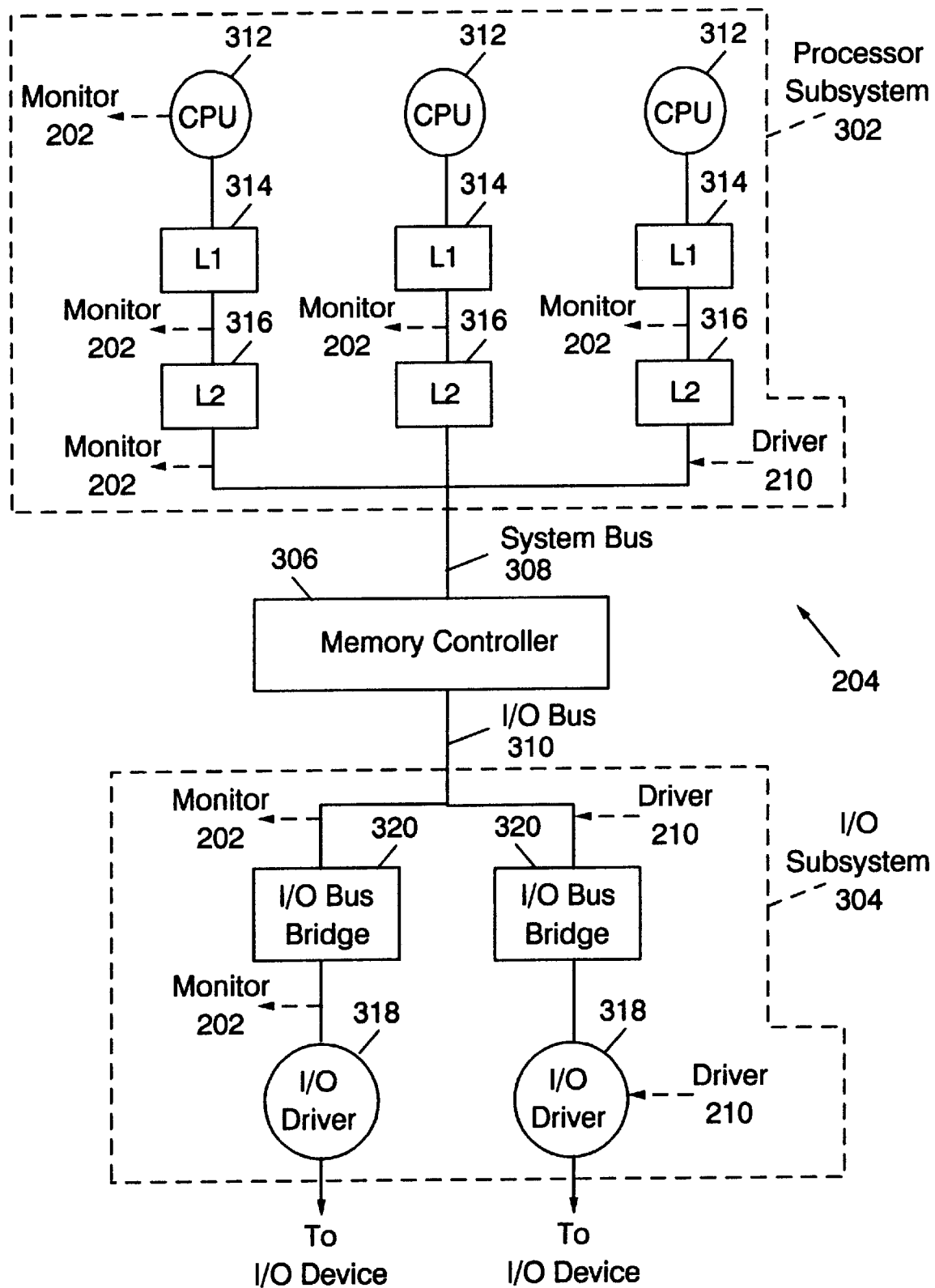
FIG. 3 illustrates an exemplary simulation system in accordance with an embodiment of the present invention.

Refer now to FIG. 3 illustrating MP simulation system 204 in further detail. MP simulation system 204 represents an exemplary MP system. MP simulation system 204 includes processor subsystem 302 and I/O subsystem 304 interfaced via memory controller 306 between system bus 308 and I/O bus 310. Processor subsystem 302 includes a plurality of CPUs 312. Each CPU 312 has a level I (L1) cache 314 and a level 2 (L2) cache 316 coupled to the corresponding L1 cache. Each of L2 caches 316 is coupled to system bus 308. I/O drivers 318 provide I/O signals to peripheral I/O devices (not shown). I/O bus bridges 320 interface I/O bus 310 and I/O drivers 318. A monitor 202 detects events in one of CPUs 312. Such events may include instructions that the CPU has begun executing, for example, load instructions. A plurality of monitors 202 detects events on each interface between L1 cache 314 and L2 cache 316. For example, such a monitor 202 may observe, as one exemplary event, L1 cache castouts. (A castout is a write back to system memory to maintain memory coherence.) Another monitor 202 reports events on system bus 308. Such a monitor may observe L2 cache castouts. Additionally, a driver 210 is provided to drive events on system bus 308. I/O bus 310 is also provided with a monitor 202 for observing events thereon, and a driver 210 in order to drive events on bus 3 10. Observed events might include read bus transactions performed by I/O bus bridge 320. Additionally, monitor 202 detects events on an interface between one of I/O bus bridges 320 and the corresponding I/O driver 318, such as read bus transactions performed by I/O driver 318. A driver 210 drives events in a peripheral I/O device via one of I/O drivers 318.

These exemplary monitor and driver locations are typical in that they are commonly found in state-of-the-art data processing systems, and are usually well-architected. However, it would be understood by an artisan of ordinary skill, that monitors drivers which may be implemented at other locations in a data processing system would be within the spirit and scope of the present invention.

Figure 4A:
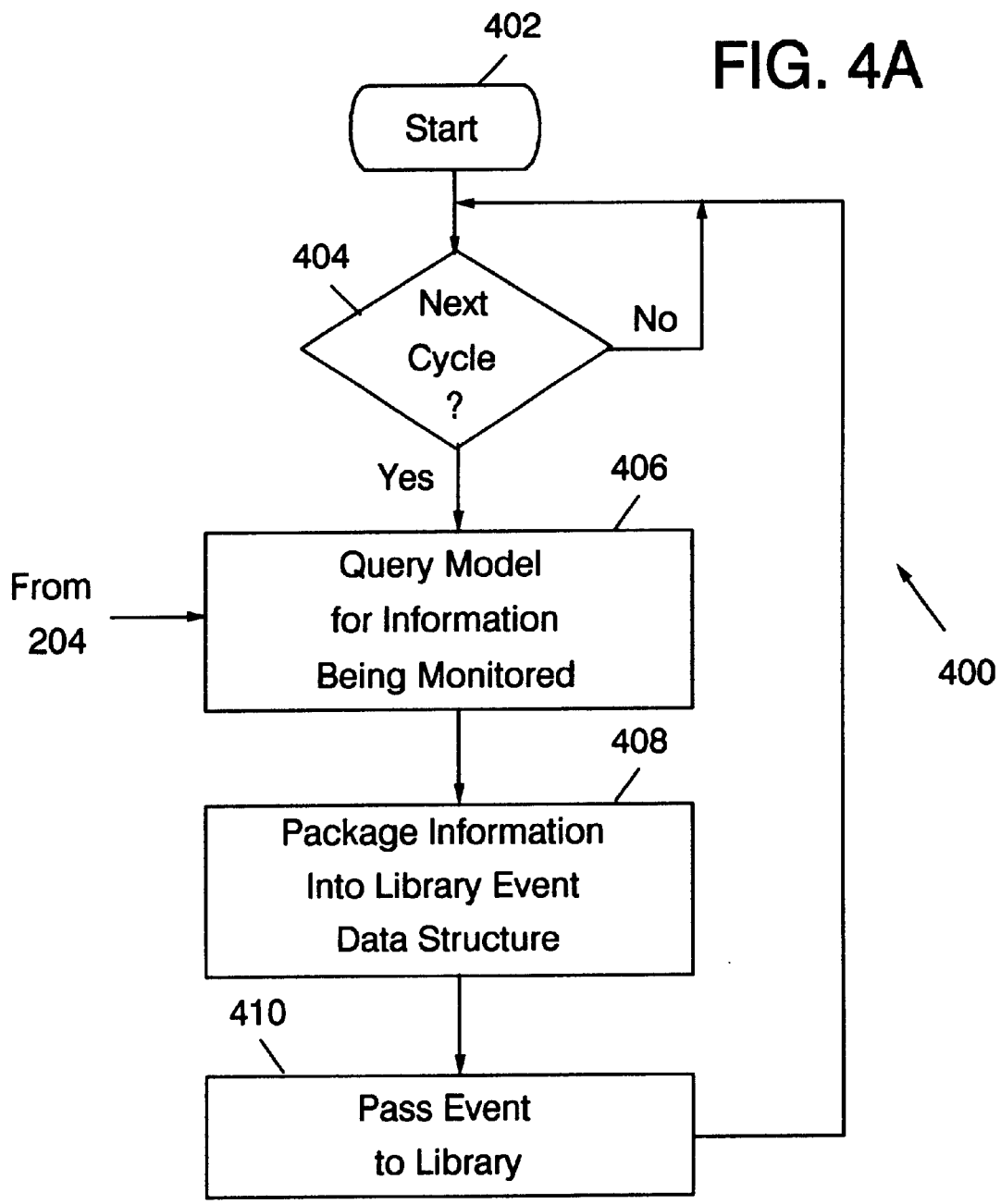
FIG. 4A illustrates, in flowchart form, a driver methodology in accordance with an embodiment of the present invention.

The operation of monitors 202 may be further understood by referring now to FIG. 4A illustrating a flowchart of a monitor methodology 400 in accordance with the present invention. Monitor methodology 400 starts in step 402 and loops, in step 404, until a next simulation cycle is carried out. The method then queries the simulation model, such as MP simulation model 204 for event information at the location in the MP simulation model corresponding to the particular monitor executing the steps of methodology 400. In step 408, the information received in step 406 is packaged into a library event data structure.

Figure 4B:
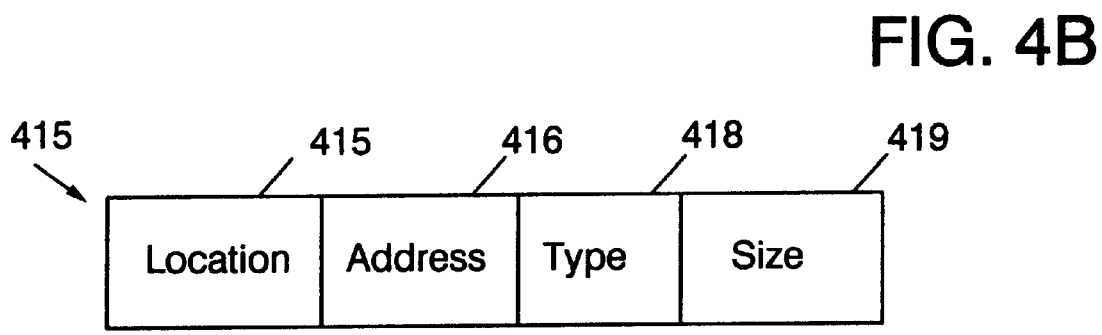
FIG. 4B illustrates a library event data structure in accordance with an embodiment of the present invention.

A library event data structure 415 is illustrated in FIG. 4B. Data structure 415 includes a plurality of fields 416–419. Field 416 contains the location, which may typically be a bus, on which the event has taken place. The address of the event, for example a read address or write address, is included in field 417. The transaction type, such as a read or write, is contained in field 418, and field 419 contains the size of any data transfer.

Returning to FIG. 4A, data structure 415 is passed to library 208, in step 410. Library 208 adds the data structure to database 206, as will be discussed in conjunction with FIGS. 5A–5B, below. Monitor method 400 then returns to step 404, and waits for the next simulation cycle.

Figure 5A:
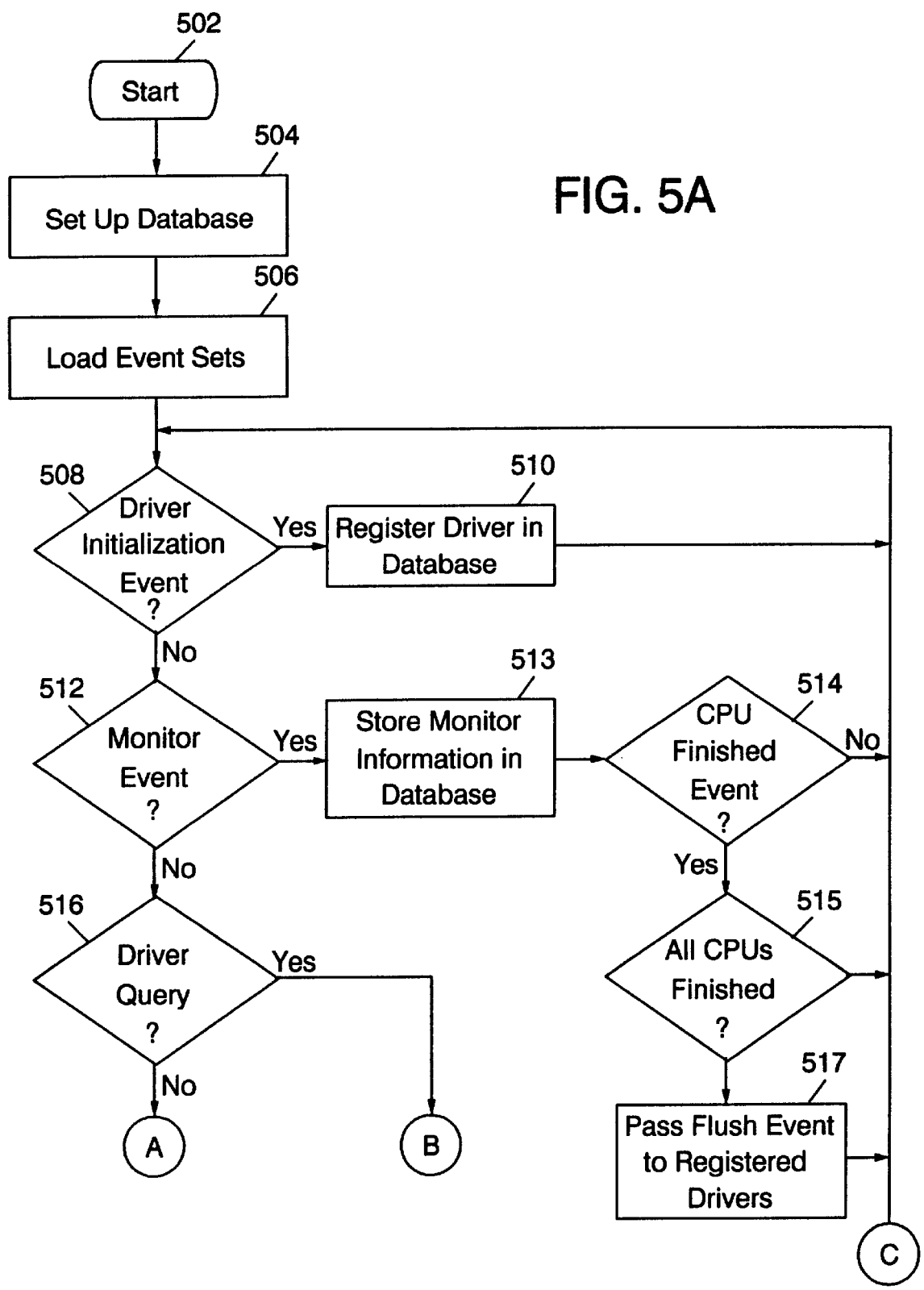
FIGS. 5A–5B illustrates, in flowchart form, a library methodology in accordance with an embodiment of the present invention.
Figure 5B:
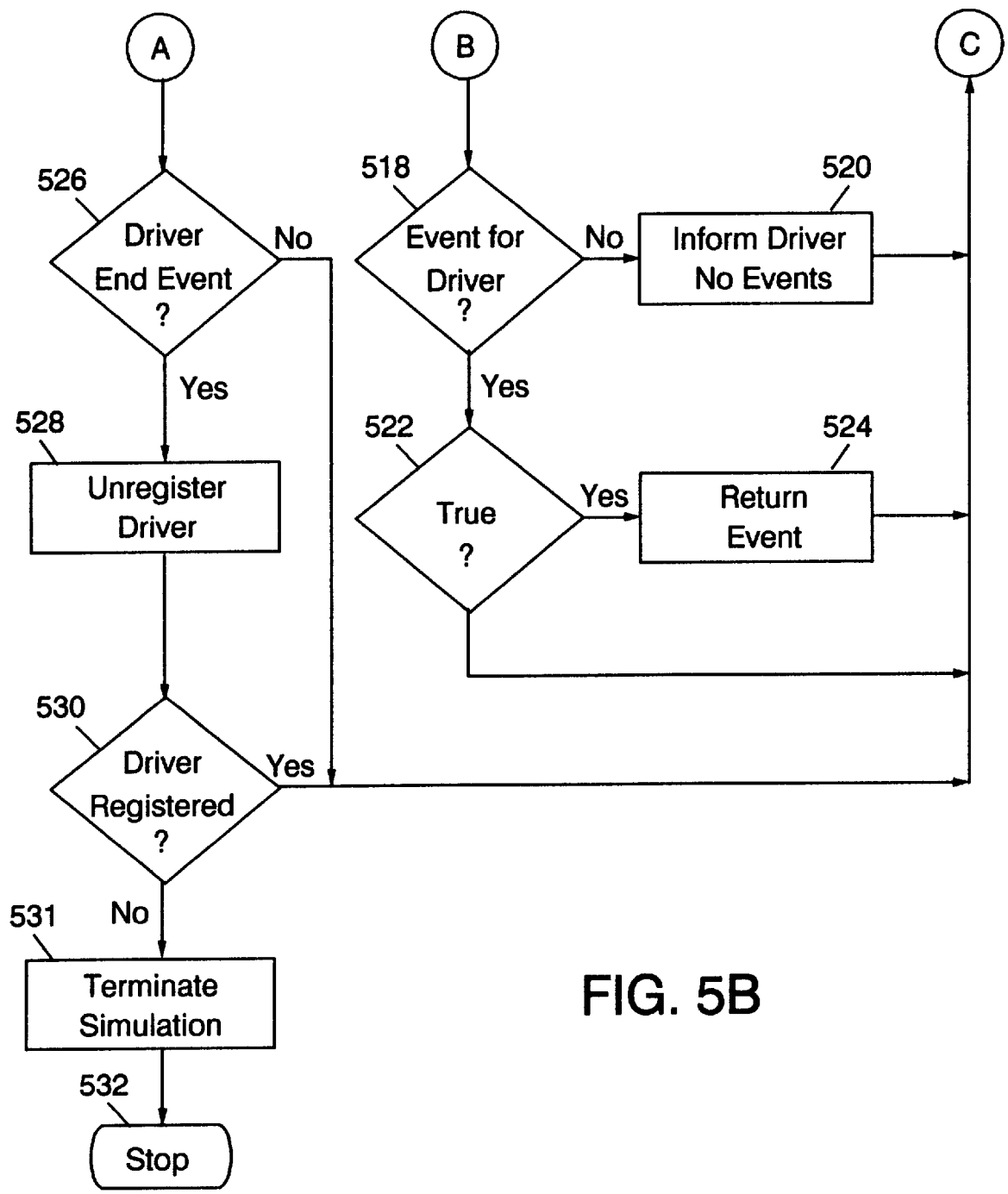

Refer now to FIGS. 5A–5B illustrating a library method 500 in accordance with the present invention. Library method 500 is launched in step 502, and in step 504, initializes database 206, in FIG. 2.

Figure 5C:
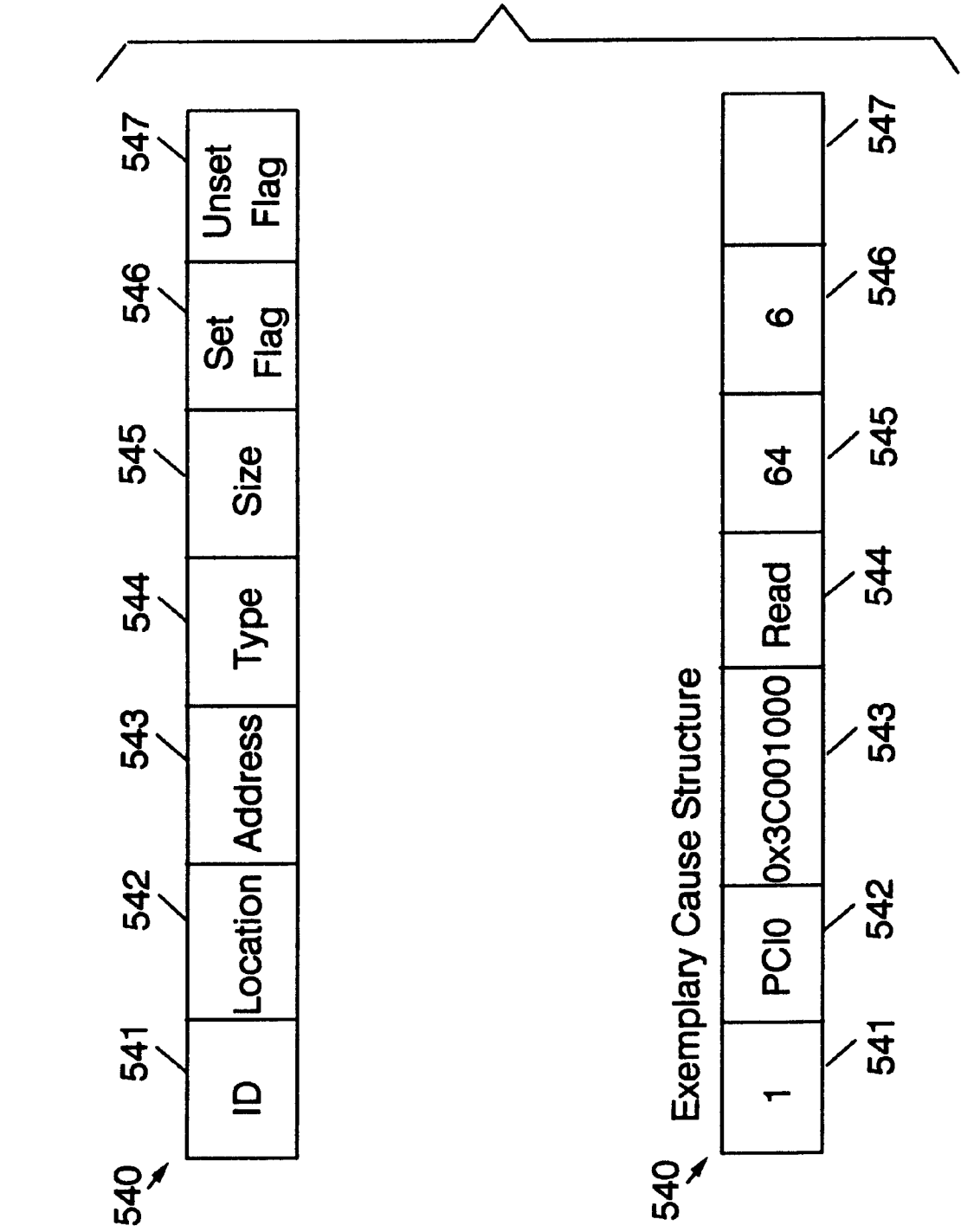
FIG. 5C illustrates cause data structures in accordance with an embodiment of the present invention.
Figure 5E:
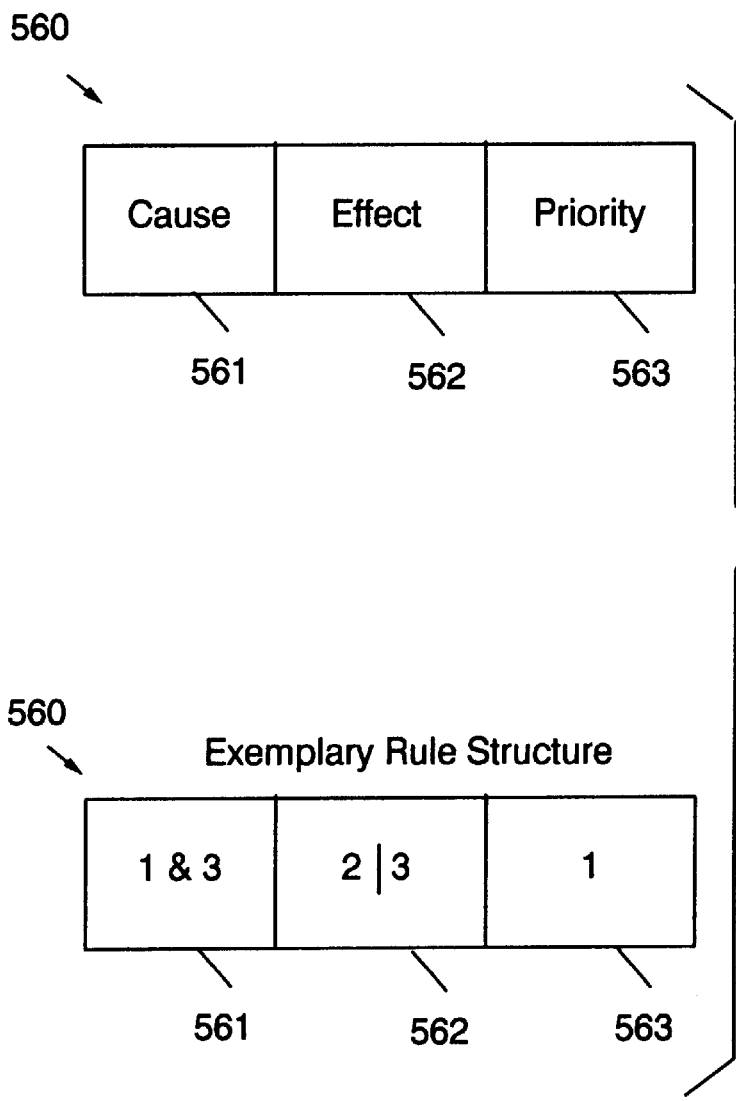
FIG. 5E illustrates a rule data structure in accordance with an embodiment of the present invention.

In step 506, predetermined event sets are loaded from the test case being simulated. The predetermined event sets include data structures specifying causes, which, as indicated above, define system states that will cause drivers to drive events, effect structures, which, also noted above, define streams of action events that specify the events to be driven by the drivers, and rule structures, which map causes to effects. Such data structures are illustrated in FIGS. 5C–5E, and will be discussed further in conjunction therewith. Event sets may be generated by a coverage tool which ensures that uncovered events are hit. Coverage tools are known in the art. For example, coverage tools are discussed in IBM Technical Disclosure Bulletin, vol. 40, No. 3, March 1997, at pp. 1–4 and pp. 158–160, which are hereby incorporated herein by reference.

Referring first to FIG. 5C, illustrated therein is a cause structure 540. Structure 540 includes a plurality of fields 541–547. Field 541 contains an identifier (ID) that identifies the cause. Reference is made to the cause using this identifier. This will be discussed further in conjunction with rules structures below. Field 542 contains the location of the event constituting the cause. Event locations may typically be buses and interfaces between integrated circuit chips. However, as previously discussed, other event locations would be within the spirit and scope of the present invention. Field 543 specifies the address of the event, field 544 includes the transaction type of the event, and field 545 specifies a size any data transfer involved in the event. Cause structure 540 also includes two flag fields, set flag in field 546 and unset flag in field 547.

The set flag specifies a flag that must have been "set" in an effect structure in order for the cause event corresponding to cause structure 540 to be true. In other words, if a set flag value is specified in field 546, the occurrence in the simulation of the corresponding event will not give rise to a resulting effect, specified by a rule structure, defining a mapping between cause and effect, unless the set flag value in field 546 has been set in an effect structure. That is, if a set flag value is specified in field 546, the cause event is ignored unless the set flag value has been specified in an effect structure. Then, the flag with a "name" corresponding to the value specified in the set flag field will be said to have been "set." A cause having a flag which has been set but not yet observed may be said to be "enabled." A cause that is both enabled and observed may be said to be "true." Conversely, an unset flag in field 547 must have been unset in an effect structure, or have never been set by an effect structure, for the cause event corresponding to structure 540 to be enabled. A flag set in a first effect structure may be unset in a second effect structure.

An exemplary cause structure 540 is also illustrated in FIG. 5C. In the exemplary cause structure, field 541 contains an ID of "1". The location field 542 contains "PCI0", denoting peripheral component interconnect (PCI) bus 0. The address field 543 contains the value "0x3C001000" as the hexadecimal address of the cause event specified in the exemplary cause structure, which is a read, as specified in field 544. The read size, in field 545, has the value "64", which may signify a 64-byte read. Thus, the exemplary cause structure 540 specifies a cause event which may be a 64-byte read from hexadecimal address 0x3C001000 on PCI bus 0. In addition, set flag field 546 has the set flag value "6". Therefore, the cause event specified by exemplary cause structure 540 will not give rise to a resulting effect, unless "flag 6" is set by specifying the set flag value "6" in an effect structure. If flag 6 has been set in an effect structure then, if a read from address "0x3C001000" of size 64-bytes on PCI bus 0 is observed by a monitor on PCI bus 0, then a corresponding effect event may be driven by one of drivers 210, FIG. 2. If the cause specified in exemplary cause structure 540 is to give rise to a resulting effect, the correspondence between the cause and effect is made via a rule structure. This will be discussed in conjunction with FIG. 5E.

Effects are specified via an event structure 550, illustrated in FIG. 5D. Effects constitute a stream of action events that are driven in response to a corresponding cause. The association of a cause and an effect is made via a rule structure, to be discussed. Effect structure 550 includes a plurality of entries 551. A number of entries is determined by the corresponding number of action events which the effect structure embodies. Each entry 551 includes a plurality of fields 552–559. Field 552 contains an effect ID. Field 553 specifies a location at which the event will take place. An effect is driven by one of drivers 210. As previously described, drivers may typically sit on buses and well-architected interfaces, and, hence, location field 553 may typically specify a bus or interface on which the corresponding event will be driven. However, it would be understood by one of ordinary skill in the art that field 553 may contain other locations that otherwise admit drivers. The address of the event to be driven is contained in address field 554, and the type in type field 555. If the event involves a data transfer, the size of the data transfer is specified in size field 556. Delay field 557 specifies how many cycles the corresponding driver should wait before driving the event. Fields 558 and 559 are the set flag and unset flag fields, respectively.

Set flag field 558 and unset flag field 559 in effect structure 550 are used in conjunction with set flag fields 546 and unset flag field 547 in cause structure 540. If a value is set in one of set flag field 558 or unset flag field 559, a cause structure 540 having the same value, or flag, set in the respective set flag field 546 or unset flag field 547 will be enabled upon execution of the effect specified by the effect structure. Note that the sole effect implemented by an effect structure may be to set or unset a flag. In this way, causes are dynamic in that the implementation of the flags makes them contingent on the occurrence of precursor effects. This will be further described in conjunction with an exemplary effect structure using flags, in FIG. 5E.

An exemplary effect structure is also illustrated in FIG. 5D. Exemplary structure 550 includes two entries 551. The first entry contains the value "1" in ID field 552, "PCI0" in location field 553, the address "0x410000" in field 554, "Write" in type field 555, "32" in type field 556 and "0" in delay field 557. A second entry 551 contains the same values in ID field 552, location field 553, size field 556 and delay field 557. Address field 554 contains the value "0x520000", and "Read" in type field 555. Exemplary structure 550 implements an action event stream having a 32-byte read to hexadecimal address 0x410000 on PCI bus 0 followed by a PCI bus 0 read operation from hexadecimal address 0x520000.

Another exemplary event structure 550, illustrating the operation of flags, is shown in FIG. 5E. This effect structure 550 has three entries 551 that correspond to three actions. The effect has an ID of "1" which appears in field 552 in each entry 551. In the first entry 551 in structure 540, set field 558 contains the value "34". The second entry 551 contains the values "PCI0", "0x231000", and "Read" in fields 553, 554, and 555, respectively. The third entry 551 includes the value "34" in unset field 559. On execution of the effect, the action stream defined by exemplary structure 550 sets flag 34, reads from PCI bus 0 at hexadecimal address 0x231000, and, following the read, unsets flag 34. A cause which required flag 34 to be set would be enabled during the read from PCI bus 0, and an effect depending on that cause might then be driven during the read, provided the cause was otherwise true. However, such an effect would not be driven after the read because unsetting flag 34 would disable the precursor cause. In this way, complex event chains may be implemented in the event set, loaded in step 506 in FIG. 5A, for the test case under simulation.

Figure 5F:
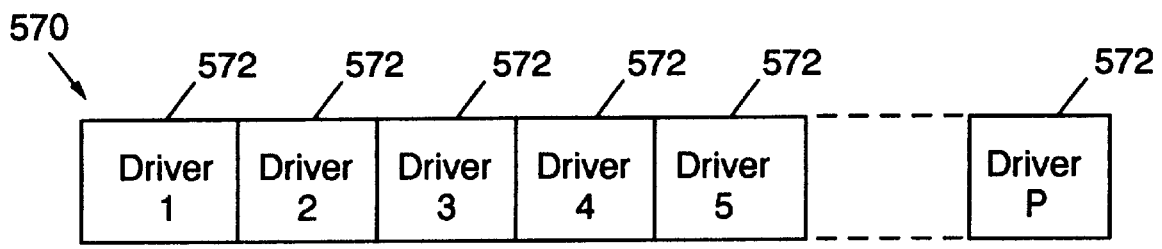
FIG. 5F illustrates a driver register data structure in accordance with an embodiment of the present invention.

Causes are mapped to associated effects via a rule structure. In FIG. 5F is illustrated rule structure 560. Rule structure 560 includes three fields: cause field 561, effect fields 562 and priority field 563. A cause, as specified in cause field 561, will, if true, result in the execution of the action stream corresponding to the effect specified in effect field 562. In other words, when the cause event specified by the cause structure 540 corresponding to the specified cause in field 561 occurs, the associated effect specified in field 562 is executed. Causes and effects are specified by their respective IDs. Additionally, cause IDs may be joined by logical operators "AND" (denoted by &) and "OR" (denoted by |). Similarly, effect IDs may be joined by logical operators. Thus, an effect specified in 562 that results from a cause in field 561 that is specified by, for example, two cause IDs joined by the logical AND operator will be driven only if both causes appearing in cause field 561 are true. If the two causes are joined by the OR operator, the effect will be driven if either cause is true. Similarly, multiple effects may be specified by joining effect IDs by logical operators. Thus, for example, two effect IDs joined by the logical operation AND will be driven simultaneously when the corresponding cause specified in field 561 occurs and is enabled (i.e., is true).

Effects specified by effect IDs joined by the OR operator are driven randomly. In other words, the OR operation signals that a decision must be made to determine which of the multiple effects specified is to be driven. The effect to be driven is chosen randomly from the events specified. The event driven is selected by drawing a random number from a probability distribution. In an embodiment of the present invention, a random variable uniformly distributed in the interval [0,1] may be used. Where a plurality, P, of effects are specified, and joined by the OR operator, the interval [0,1] may be subdivided into P equal sub-intervals, and each such sub-interval associated with one of the plurality of effects. The effect that is driven may then be that effect corresponding to the sub-interval in which the selected random number lies. In such an embodiment, each effect of the plurality would have an equal likelihood of being driven. It would be understood by an artisan of ordinary skill that other probability distributions would be within the spirit and scope of the present invention.

Multiple rule structures 560 may be implemented. Moreover, because a multiplicity of causes may be specified in a particular rule structure 560, or multiple rule structures 560 having a same cause specified in cause field 561 may be implemented, multiple rule structures 560 may, simultaneously, be true. In such instances, the effect triggered will be determined by values specified in priority field 563 in each of the rules 560 that are true. In an embodiment of the present invention, a first priority, second priority, third priority, etc. may be associated with an increasing sequence of values in priority fields 563. Alternatively, the first priority, second priority, third priority, etc. may be associated with a decreasing sequence of values in priority fields 563. Additionally, multiple rule structures 560 may simultaneously be true and have a same priority value in field 563. In such a case, in accordance with the present invention, the event to be triggered is determined by randomly selecting a rule structure from among the multiplicity of true rule structures 560. Random selection from among rule structures 560 may be performed in a fashion similar to the random selection from among effects, as discussed herein above, and therefore will not be repeated in the interest of brevity. It would be understood, however, that a random distribution used in randomly selecting from among rule structures need not be the same random distribution used in selecting among a multiplicity of effects specified by a given rule structure 560.

An exemplary rule structure is also illustrated in FIG. 5F. Exemplary structure 560 includes the value "1&3" in cause field 561, the value "2|3" in effect field 562, and a priority of "1" in priority field 563. Exemplary structure 560 will be true if the cause specified by a cause structure 540 having an ID of "1" in field 541 and a cause structure 540 having an ID of "3" in field 541 both occur. Then, an effect specified in an effect structure 550 having an ID of "2" in field 552 or an effect corresponding to an effect structure 550 having an ID of "3" in field 552 will be driven. The choice between the effect specified by effect structure 550 having the ID of "2" and the effect specified by an effect structure 550 having an ID of "3" is made by drawing a random number from a predetermined random distribution, as previously discussed. Field 563 contains the value "1". In an embodiment of the present invention, this may denote a rule structure 560 having a highest priority. In an alternative embodiment, the value "1" in priority field 563 may denote a rule structure 560 having a lowest priority. In the absence of a priority specified in field 563, a default may be assigned, in an embodiment of the present invention.

The driver event sets loaded in step 506 include a plurality of cause structures 540, effect structures 550 and rule structures 560. These define the causes and effects that will be monitored, and driven, respectively, during the simulation. The observation of cause events and the driving of events in response thereto are mediated by library method 500 using the data stored in database 206 which includes the driver event sets loaded into database 206, in step 506.

Library method 500 enters a loop in which events are detected. In step 508, library method 500 determines if a driver initialization event has been received. Driver initialization events are issued by a driver method, to be discussed in conjunction with FIG. 6. If, in step 508, a driver initialization event has been received, the driver issuing the event is registered into database 206, FIG. 2, and method 500 then continues by looping for events. Database 206 includes a driver register data structure 570, FIG. 5F. Driver register 570 contains a plurality P, of fields 572 corresponding to a predetermined plurality of drivers defined in the simulation model. A driver 202 is registered by setting a predetermined data value in a corresponding field 572. Registering a driver informs library 208 that the driver can accept events. For example, in an embodiment of the present invention, each field 572 may be one bit wide, and registering a driver 202 may entail setting the corresponding bit 572. Other widths of fields 572, and other data values would be within the spirit and scope of the present invention.

If, in step 508 a driver initialization event has not been received in step 512, a determination is made whether a monitor event is received. If a monitor event has been received, in step 513 the monitor information is stored in database 206. The information is stored in the form of a data structure described in conjunction with step 408 in FIG. 4A.

In step 514, it is determined of the event received was a CPU finished event. CPU finished events are monitor events sent by monitors 202 in CPUs 312 when the corresponding CPU finishes execution. If, the event is a CPU finished event, it is determined, in step 515 if all CPUs 312 have finished execution. If all CPUs have finished, library 208, FIG. 2, passes flush queue events to each registered driver 210, step 517. The receipt of a flush queue event by a driver will be discussed below in conjunction with FIG. 6. If however, either the event received in step 512 was not a CPU finished event, step 514, or all CPUs have not finished, step 515, method 500 returns to step 508.

If, a monitor event has not been received in step 512, in step 516 library method 500 determines if a driver query has been received. If, in step 516, a driver query has been received, a portion of database 206 containing the driver event sets loaded in step 506 are searched for events corresponding to the driver issuing the query, step 518. If, in step 518, there are no events for the driver, the library method 500 informs the driver there are no events, in step 520, and method 500 returns to step 508 and continues to loop for events.

If, in step 518, there are events for the driver issuing the query, in step 522 it is determined if any events are true, in step 522. If, in step 522, there are true events, the true events are returned to the driver in step 524. If, in step 522 multiple events are true, the event returned in step 524 is determined by drawing from a random distribution, as described herein above. After returning the event in step 524, library method 500 continues to loop for events by returning to step 508. If, in step 522 no true events were found, method 500 returns to step 508, and continues to loop for events.

Returning to step 526, if a driver query has not been received, library method 500 determines, in step 526, if a driver end event has been received. Driver end events are associated with a termination of the test case under simulation, and will be described in conjunction with FIG. 6. If a driver end event, in step 526 has not been received, then method 500 continues to loop for events. Otherwise, in step 526, the "Yes" branch is followed, and in step 528 the driver issuing the driver end event is unregistered from database 206 by resetting the data value in the corresponding field 572 in driver register structure 570, FIG. 5F. In an embodiment having fields 572 that are one bit wide, unregistering the driver may entail resetting the corresponding bit 572. If, in step 530, any drivers remain registered, library method 500 continues to loop for events. Otherwise, library 208, via method 500, terminates the simulation, in step 531, and then stops in step 532.

Figure 6:
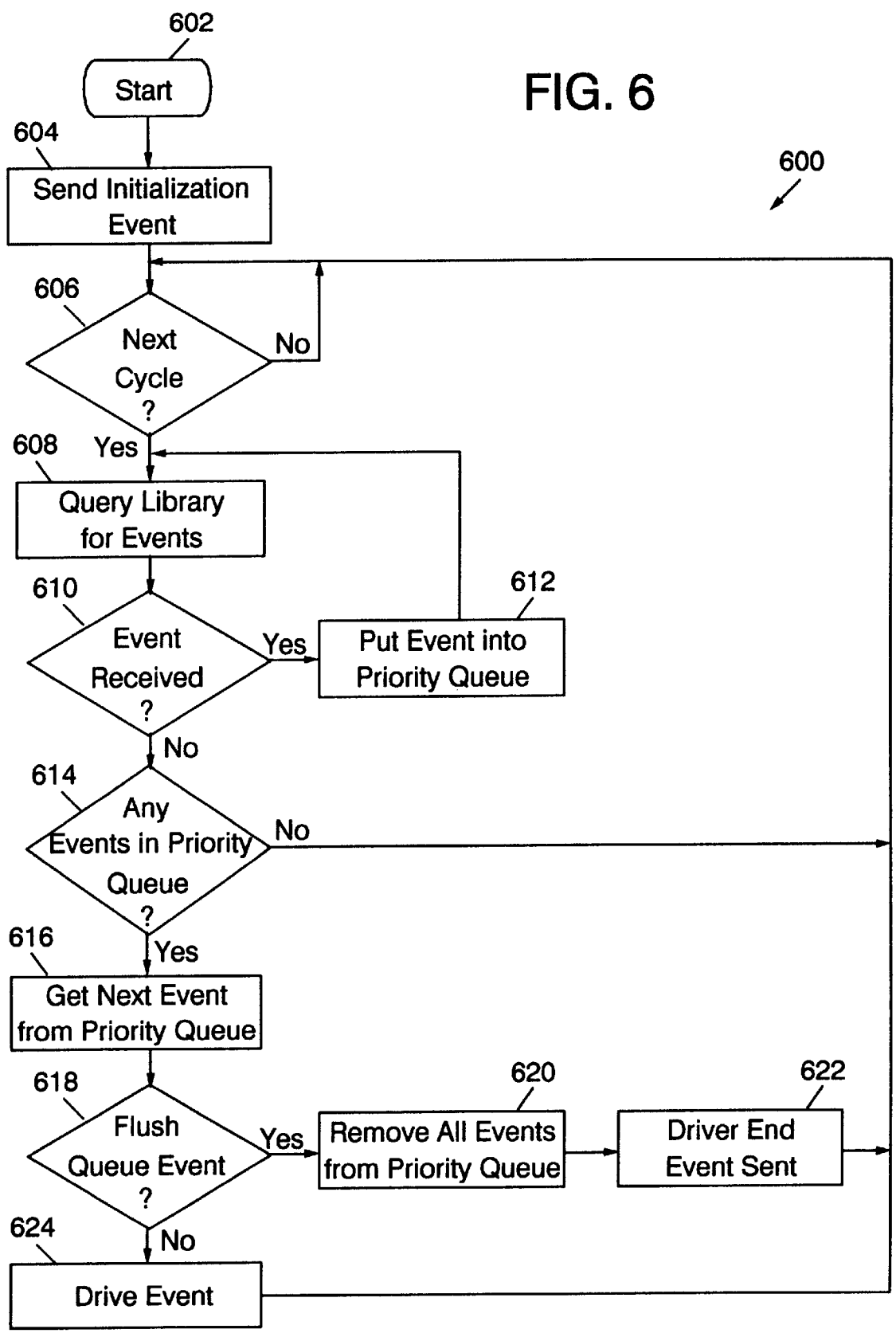
FIG. 6 illustrates, in flowchart form, a driver methodology in accordance with an embodiment of the present invention.

Refer now to FIG. 6 in which a driver methodology 600 flowchart is illustrated. Driver method 600 is launched in step 602, and in step 604 a driver initialization event is sent to library method 500. The sending of a driver initialization event in step 604 results in driver method 500, in step 508, following the "Yes" branch, as described herein above in conjunction with FIG. 5A. The sending of an initialization event constitutes sending driver information to library method 500, which is entered in database 202 in step 510, FIG. 5A.

In step 606, method 600 waits for a next simulation cycle, then queries library method 500 for events, in step 608. Library method 500, in FIG. 5A, responds to the driver query, in step 516, and issues any events for the particular driver associated with method 600, as previously described.

If library method 500 returns events in step 524 thereof, driver methodology 600 determines, in step 610 that an event has been received. The event is put into a priority queue, in step 612. Events are put into the priority queue in accordance with a priority value in field 563 of a rule structure 560, as described in conjunction with FIG. 5E, above.

Driver methodology 600 then loops and continues to query the library for events until events are no longer received in step 610.

Methodology 600 then drives events. In step 614, driver method 600 determines if there are any events the priority queue. If not, method 600 returns to step 606, and waits for the next simulation cycle. Otherwise, the next event in the priority queue is retrieved from the queue, step 616. Before driving the event retrieved in step 616, in step 618 is determined if a flush queue event has been received from the test case.

If a flush queue event has not been received, then the driver drives the events in the priority queue. In step 624, the event retrieved from the priority queue in 616 is driven by the driver executing methodology 600 by generating the corresponding system state at the location of the driver. Method 600 then returns to step 606 and waits for the next simulation cycle , when the next event may be driven. If, before the next simulation cycle, an event having a higher priority than the next event in the queue comes in, by returning to step 606, method 600 may service the higher priority event first.

If, however, in step 618 a flush queue event has been received, step 618 follows the "Yes" branch. Flush queue events are sent by library 208, FIG. 2, as discussed in conjunction with library method 500, FIG. 5A. As previously described, flush queue events are sent in response to all CPUs 312 having finished execution. If a flush queue event has been received, in step 620 all events are removed from the priority queue and the driver completes any events begun but not completed when the flush queue event was received. In step 622 a driver end event is sent. The driver end event is received by driver methodology 500 in step 526, causing the driver to be unregistered in step 528, as previously described. Only when all drivers 202 are unregistered, as discussed in conjunction with steps 3530, and 531, FIG. 5B, does the simulation terminate. In this way, a simulation run does not end while a driver event has been started but not completed. Methodology 600 then returns to step 606 and awaits the next simulation cycle.

In this way, dynamic event triggering in data processor simulations is provided. Events to be driven, effects, and precursor events, causes, which serve as predicates to associated effects are provided in the test case as a set of data structures incorporated into a database. A library methodology provides the interface between the database, monitors defined in the test case which report events at the location of the monitor in the data processing system under simulation. Observed events are logged into the database by the library methodology, and the library methodology mediates the driving of events in response to observations by the monitors using the event set loaded in the database. The library methodology mediates the driving events by issuing events to the drivers in response to queries sent by each driver in each simulation cycle. Because the set of events used by the library methodology to determine which events are to be driven by the drivers are provided to the library methodology by the test case under simulation, the driven events are correlated with the states generated by the test case.

Although the present invention and its advantages have been described in detail, it should be understood that various changes, substitutions and alterations can be made herein without departing from the spirit and scope of the invention as defined by the appended claims.

What is claimed is:

1. A method of simulation event triggering comprising the steps of:
    providing a predetermined set of data structures, wherein a first subset of said data structures define precursor states in a simulation model, a second subset define a plurality of effects, and a third subset define rules mapping precursor states to one or more corresponding effects; and
    driving at least one of said plurality of effects, wherein said effect is operable in response to a simulation event corresponding to at least one of said precursor events, wherein said step of driving said effect comprises the steps of:
        passing a data structure corresponding to said effect to a driver; and
        generating a system state corresponding to said data structure at a predetermined location corresponding to said driver.

2. The method of claim 1 wherein said event is driven on a predetermined location in said simulation model.

3. The method of claim 1 further comprising the step of issuing a query for one or more events to be driven.

4. The method of claim 1 wherein said predetermined set of data structures is stored in a database.

5. The method of claim 4 further comprising the step of receiving said simulation event, wherein said step of receiving a simulation event further comprises the step of entering a data structure corresponding to an event observed in said simulation model into said database.

6. The method of claim 4 wherein said event being driven is retrieved from said database.

7. The method of claim 1 wherein said step of driving said effect further comprises the step of storing said effect in a priority queue.

8. The method of claim 7 wherein said effect is stored in said queue in accordance with a data value in a portion of a data structure included in said third subset, said data structure mapping a preselected cause to said effect.

9. The method of claim 1 wherein said step of driving said effect includes the step of selecting said effect from said plurality of effects in accordance with a value of a random variable drawn from a predetermined random distribution.

10. The method of claim 1 wherein said simulation model comprises a multiprocessor (MP) simulation model.

11. A computer program product adaptable for storage on storage media, the program product operable for simulation event triggering, the program product comprising:
    programming for providing a predetermined set of data structures, wherein a first subset of said data structures define precursor states in a simulation model, a second subset define a plurality of effects, and a third subset define rules mapping precursor states to one or more corresponding effects; and
    programming for driving at least one of said plurality of effects, wherein said effect is operable for in response to a simulation event corresponding to at least one of said precursor events, wherein said programming for driving said effect comprises:
        programming for passing a data structure corresponding to said effect to a driver; and
        programming for generating a system state corresponding to said data structure at a predetermined location corresponding to said driver.

12. The program product of claim 11 wherein said event is driven on a predetermined location in said simulation model.

13. The program product of claim 11 further comprising programming for issuing a query for one or more events to be driven.

14. The program product of claim 11 wherein said predetermined set of data structures is stored in a database.

15. The program product of claim 14 wherein said event being driven is retrieved from said database.

16. The program product of claim 11 further comprising programming for issuing a query for one or more events to be driven.

17. The program product of claim 11 wherein said programming for driving said effect further comprises programming for storing said effect in a priority queue.

18. The program product of claim 17 wherein said effect is stored in said queue in accordance with a data value in a portion of a data structure included in said third subset, said data structure mapping a preselected cause to said effect.

19. The program product of claim 11 wherein said programming for driving said effect includes programming for selecting said effect from said plurality of effects in accordance with a value of a random variable drawn from a predetermined random distribution.

20. The program product of claim 11 wherein said simulation model comprises a multiprocessor (MP) simulation model.

21. A data processing system for simulation event triggering comprising:
   circuitry operable for providing a predetermined set of data structures, wherein a first subset of said data structures define precursor states in a simulation model, a second subset define a plurality of effects, and a third subset define rules mapping precursor states to one or more corresponding effects; and
   circuitry operable for driving at least one of said plurality of effects, wherein said effect is operable for in response to a simulation event corresponding to at least one of said precursor events, wherein said circuitry operable for driving said effect comprises:
      circuitry operable for passing a data structure corresponding to said effect to a driver; and
      circuitry operable for generating a system state corresponding to said data structure at a predetermined location corresponding to said driver.

22. The data processing system of claim 21 wherein said event is driven on a predetermined location in said simulation model.

23. The data processing system of claim 21 further comprising circuitry operable for issuing a query for one or more events to be driven.

24. The data processing system of claim 21 wherein said predetermined set of data structures is stored in a database.

25. The data processing system of claim 24 further comprising circuitry operable for receiving said simulation event, wherein said circuitry operable for receiving a simulation event further comprises circuitry operable for entering a data structure corresponding to an event observed in said simulation model into said database.

26. The data processing system of claim 24 wherein said event being driven is retrieved from said database.

27. The data processing system of claim 21 wherein said circuitry operable for driving said effect further comprises circuitry operable for storing said effect in a priority queue.

28. The data processing system of claim 27 wherein said effect is stored in said queue in accordance with a data value in a portion of a data structure included in said third subset, said data structure mapping a preselected cause to said effect.

29. The data processing system of claim 21 wherein said circuitry operable for driving said effect includes circuitry operable for selecting said effect from said plurality of effects in accordance with a value of a random variable drawn from a predetermined random distribution.

30. The data processing system of claim 21 wherein said simulation model comprises a multiprocessor (MP) simulation model.

* * * * *